United States Patent
Yang et al.

(10) Patent No.: US 12,261,152 B2
(45) Date of Patent: Mar. 25, 2025

(54) VERTICAL INTERCONNECT STRUCTURES IN THREE-DIMENSIONAL INTEGRATED CIRCUITS

(71) Applicant: Taiwan Semiconductor Manufacturing Company, Ltd., Hsinchu (TW)

(72) Inventors: Tzu-Hsien Yang, Hsinchu (TW); Hiroki Noguchi, Hsinchu (TW); Hidehiro Fujiwara, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/620,591

(22) Filed: Mar. 28, 2024

(65) Prior Publication Data

US 2024/0243105 A1    Jul. 18, 2024

Related U.S. Application Data

(62) Division of application No. 17/538,029, filed on Nov. 30, 2021, now Pat. No. 11,978,723.

(60) Provisional application No. 63/168,462, filed on Mar. 31, 2021.

(51) Int. Cl.
*H01L 25/065* (2023.01)
*H01L 25/00* (2006.01)

(52) U.S. Cl.
CPC .......... *H01L 25/0657* (2013.01); *H01L 25/50* (2013.01); *H01L 2225/06544* (2013.01)

(58) Field of Classification Search
CPC ................. H01L 25/0657; H01L 25/50; H01L 2225/06544
See application file for complete search history.

(56) References Cited

U.S. PATENT DOCUMENTS

| | | | |
|---|---|---|---|
| 11,257,564 B1 * | 2/2022 | Lu | G11C 29/50 |
| 11,289,135 B1 * | 3/2022 | Nakazawa | G11C 7/222 |
| 11,798,914 B2 * | 10/2023 | Liu | H01L 21/6835 |
| 11,804,479 B2 | 10/2023 | Wuu et al. | |
| 11,978,723 B2 * | 5/2024 | Yang | H01L 25/0657 |
| 2020/0273788 A1 * | 8/2020 | Noebauer | H01L 23/49562 |
| 2021/0225736 A1 * | 7/2021 | Kim | H01L 21/76877 |
| 2021/0225784 A1 * | 7/2021 | Shilimkar | H01L 24/48 |
| 2021/0242159 A1 * | 8/2021 | Teng | H01L 23/5386 |
| 2022/0173046 A1 * | 6/2022 | Gomes | H01L 25/18 |
| 2022/0375865 A1 | 11/2022 | Pietambaram et al. | |
| 2022/0406751 A1 | 12/2022 | Elsherbini et al. | |
| 2023/0034737 A1 | 2/2023 | Wang et al. | |

(Continued)

FOREIGN PATENT DOCUMENTS

| | | | |
|---|---|---|---|
| JP | 2018-170471 A | 11/2018 | |
| KR | 10-2014-0085742 A | 7/2014 | |
| KR | 10-2014-0109833 A | 9/2014 | |

*Primary Examiner* — Thao P Le
(74) *Attorney, Agent, or Firm* — Merchant & Gould P.C.

(57) ABSTRACT

A 3D IC structure includes multiple die layers, such as a top die layer and a bottom die layer. The top die layer and/or the bottom die layer each includes devices such as computing units, Analog-to-Digital converters, analog circuits, RF circuits, logic circuits, sensors, Input/Output devices, and/or memory devices. The devices on the first and the second die layers are laterally surrounded by, or adjacent, vertical interconnect structures (VIS).

20 Claims, 15 Drawing Sheets

(56) References Cited

U.S. PATENT DOCUMENTS

| | | |
|---|---|---|
| 2023/0069031 A1 | 3/2023 | Wu et al. |
| 2023/0085944 A1 | 3/2023 | Nie et al. |
| 2023/0088170 A1 | 3/2023 | Brun et al. |
| 2023/0144206 A1 | 5/2023 | Dogiamis et al. |
| 2023/0170327 A1 | 6/2023 | Yang et al. |

* cited by examiner

VERTICAL INTERCONNECT STRUCTURES IN THREE-DIMENSIONAL INTEGRATED CIRCUITS

PRIORITY CLAIM AND CROSS-REFERENCE

The present application is a division of U.S. patent application Ser. No. 17/538,029 and claims the benefit of U.S. Provisional Patent Application No. 63/168,462 titled "Through-Silicon Vias In Three-Dimensional Integrated Circuits" and filed on Mar. 31, 2021, of which the entire disclosures are hereby incorporated by reference in their entirety.

BACKGROUND

Three-dimensional (3D) stacked chips or integrated circuits (IC) are an integration technology that can be used in modern computing and electronic systems. Through-silicon vias (TSVs) are used to electrically connect two or more stacked dies. For example, a TSV can enable a heterogeneous integration of a computation die and a memory die to reduce the footprint of the stacked dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
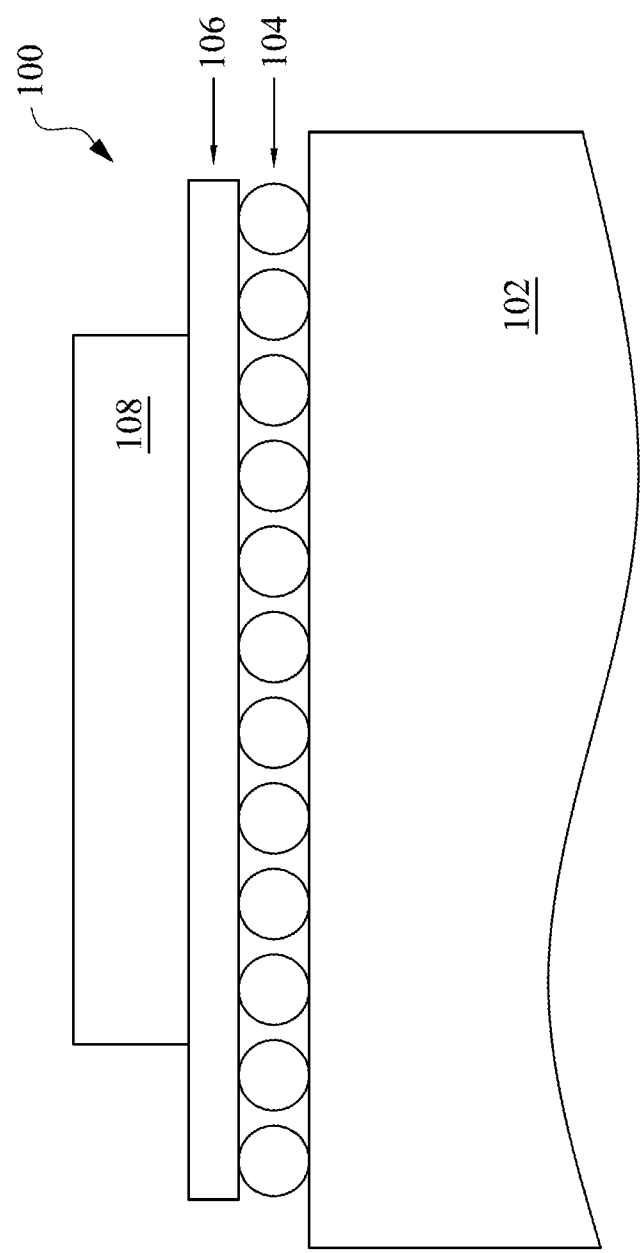
FIG. 1 illustrates a 3D IC package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein provide 3D IC structures that include multiple die layers, such as a top die layer and a bottom die layer. The top die layer and/or the bottom die layer includes devices such as computing units, Analog-to-Digital converters (ADCs), analog circuits, RF circuits, logic circuits, sensors, Input/Output (I/O) devices, and/or memory devices. Example memory devices include Static Random Access Memory (SRAM), Resistive Random Access Memory (RRAM), Dynamic Random Access Memory (DRAM), cache, and/or Flash Memory. Example computing units are microprocessors, field-programmable gate arrays, graphics processing unit, and the like.

Vertical interconnect structures (VIS) are formed in the die layers of a 3D IC structure. The VISs can be any suitable type of vertical interconnect structures, such as through-silicon vias (TSVs), through-glass vias (TGVs), and through-dielectric vias (TDVs). As will be described in more detail later, in one embodiment, the floorplan of the devices and the VISs in at least one die layer in a 3D IC differs from the floorplan of the devices and the VISs in another die layer in the 3D IC.

The VISs can be used to transmit power signals, data signals, and bias voltage signals (e.g., analog bias signals). The VISs in each die layer are arranged in a grid layout on the die layer. The VISs in a die layer may be arranged in a grid layout around the device or devices on the die layer. The grid layouts of the VISs can improve the fabrication process that is used to manufacture the die layer, which in turn may increase the yield of the VISs. Additionally or alternatively, when the density of the VISs is uniform on a die layer, the uniform density reduces the resistance between the VISs and the devices, and the IR drop in the power signals can be reduced.

FIG. 1 illustrates a 3D IC package in accordance with some embodiments. The 3D IC package 100 includes a substrate 102. The substrate 102 may be any suitable type of substrate, such as a silicon-based substrate or a printed circuit board. Electrical connectors 104 are disposed between the substrate 102 and an interposer 106. In the illustrated embodiment, the electrical connectors 104 are solder bumps, but other embodiments are not limited to this implementation. The electrical connectors 104 can be any suitable electrical connector, such as wire bonds or a ball grid array.

The electrical connectors 104 transmit power signals, data signals, and/or bias signals between the substrate 102 and the interposer 106. The interposer 106 is configured to route the signals between the electrical connectors 104 and the 3D IC 108. The 3D IC 108 includes two or more die layers stacked vertically and one or more VIS in each die layer to electrically connect the die layers to each other. In some embodiments, the 3D IC 108 is a heterogeneous 3D IC where the types of devices on one die layer differ from the types of devices on another die layer. For example, the types of devices on a bottom die layer can be memory devices and the types of devices on a top die layer may be computing units. In other embodiments, the 3D IC 108 is a homogeneous 3D IC where the same type of devices is formed in and/or on the die layers.

As will be described in more detail later, the VISs in one die layer in the 3D IC 108 are arranged in a layout that can differ from the arrangement of the VISs in another die layer. The different layouts can vary to meet improved or optimum area usage and/or routing requirements. For example, an electronic design application (EDA) can be used to determine the best or optimum layout for the VISs in a die layer based on the power requirements of the devices on that die layer as well as the power requirements of the devices on any die layers disposed above the die layer.

Additionally or alternatively, the diameter, the pitch, and the density of the VISs are the same on one die layer but the diameter, the pitch, and/or the density of the VISs can differ on another die layer. The VIS layout, the diameter, the pitch, and the density of the VIS in each die layer are based on, for example, the power requirements of the devices on a die layer, the power requirements of the devices on an upper die layer(s), and/or the IR drop experienced by the power signals, data signals, and/or analog bias signals at the upper die layer(s). For example, when a 3D IC is formed with two die layers, the layout of the VISs in the bottom die layer is based on the power requirements of the devices on the bottom die layer, the power requirements of the devices on the top die layer, and/or the IR drop experienced by the power signals, data signals, and/or analog bias signals at the top die layer. The layout of the VISs in the top die layer is based on the power requirements of the devices on the top die layer. When the power signals are input into the 3D IC at the bottom die layer, the density of the VISs in the bottom die layer is typically greater than the density of the VISs in the top die layer because the VISs in the bottom die layer have to provide a sufficient or minimum amount of power to the devices on the top die layer to maintain the integrity of the operations of the devices on the top die layer.

Figure 2:
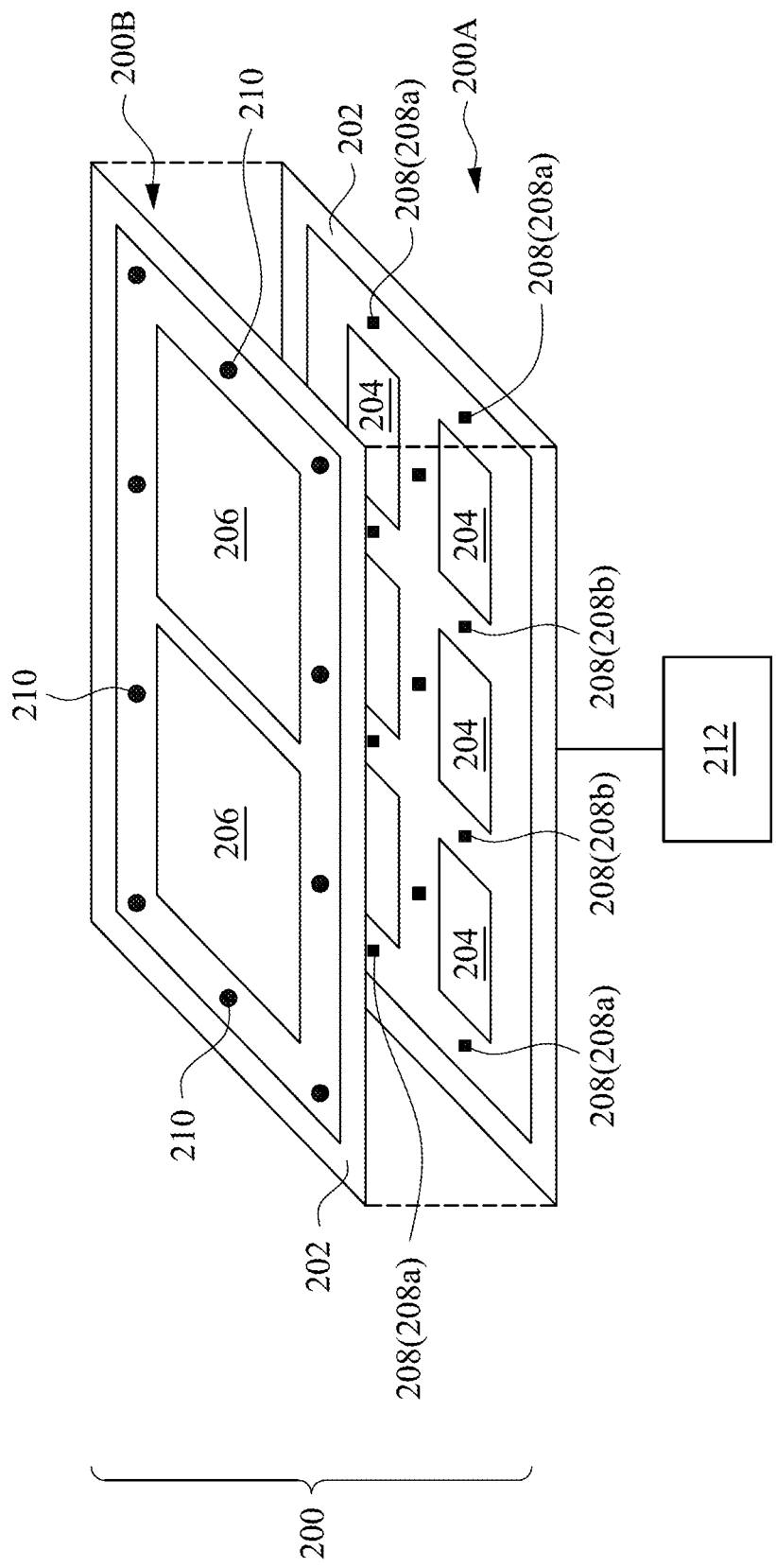
FIG. 2 illustrates a first example 3D IC structure in accordance with some embodiments.

FIG. 2 depicts an example 3D IC structure in accordance with some embodiments. The 3D IC structure 200 includes multiple die layers. For illustration purposes, FIG. 2 includes select portions of a 3D IC structure. Other portions that are not shown may be included in a 3D IC structure. For example, micro-bumps, molding regions, dummy regions, adhesion layers, a heat sink, interconnects, ball grid array (BGA) connectors, silicon interposers, and other components or structural elements may be included.

In the illustrated embodiment, the 3D IC structure 200 includes a die layer 200A and a die layer 200B disposed over the die layer 200A. Other embodiments of a 3D IC structure can include additional die layers (e.g., 3, 5, or 8). In some embodiments, peripheral structures 202 can provide mechanical support and/or provide thermal conduction for heat dissipation.

The die layer 200A includes devices 204. Example devices 204 include, but are not limited to, memory devices and I/O devices. The die layer 200B includes devices 206. The devices 206 on the die layer 200B may be the same type of devices or a variety of different devices. In a non-limiting embodiment, the devices 206 are computing units. In other embodiments, when the 3D IC structure is a heterogenous 3D IC structure, the die layer 200A can include one or more computing units and the die layer 200B may include RF and analog circuits. In another example embodiment of a heterogeneous 3D IC, the die layer 200A can include logic circuits and memory devices, and the die layer 200B may include sensors, input/output (I/O) devices, and one or more computing units.

The die layer 200B is electrically connected to the die layer 200A through the VISs 208 on the die layer 200A and the VISs 210 on the die layer 200B. One or more devices 204 are electrically connected to one or more respective devices 206 through VISs 208, 210. As discussed earlier, the VISs 208, 210 include TSVs, TDVs, or other types of vertical interconnect structures. In the illustrated embodiment, the VISs 208, 210 are TSVs. The TSVs can be power TSVs, data signal TSVs, and bias TSVs. For example, the VISs 208a positioned around the periphery of the bottom die layer 200A may be data signal TSVs and the VISs 208b disposed between the devices 204 can be power TSVs.

The VISs 208 in the die layer 200A are arranged in a first layout, while the VISs 210 on the die layer 200B are arranged in a different second layout. As described earlier, the layout of the VISs 208 on the die layer 200A is based at least on factors such as the power requirements of the devices 204 on the die layer 200A, the power requirements of the devices 206 on the die layer 200B, and/or the IR drop experienced by the power signals, data signals, and/or analog bias signals. The layout of the VISs 210 on the die layer 200B is at least based on the power requirements of the devices 206 on the die layer 200B. In some instances, the layouts of the VISs 208, 210 can also be based on an improved or optimized consumption of the die area on the die layers 200A, 200B.

In the illustrated embodiment, a power supply 212 is electrically connected to the 3D IC structure 200 through electrical connectors, such as the electrical connectors 104 shown in FIG. 1. The power supply 212 provides power to the devices 204, 206 on the die layers 200A, 200B. The power is supplied to the die layers 200A, 200B through at least some of the VISs 208, 210.

As shown in FIG. 2, the floorplan of the devices 204 and the VISs 208 on the die layer 200A differs from the floorplan of the devices 206 and the VISs 210 on the die layer 200B. The number of devices 204, the number of VISs 208, and the layout of the VISs 208 in the die layer 200A is different from the number of devices 206, the number of VISs 210, and the layout of the VISs 210 in the die layer 200B. Accordingly, the design and the fabrication of each die layer 200A, 200B can be optimized or selected based on the requirements of the respective die layers 200A, 200B. For example, when the device 206 is a processing unit, a more expensive fabrication process may be used to manufacture the die layer 200B due to the high-speed requirements for the processing unit. Alternatively, when the devices 204 on the die layer 200A include memory devices, analog devices, and/or a logic devices, a less expensive fabrication process can be used to manufacture the die layer 200A due to the slower speed requirements of these types of devices.

Figure 3:
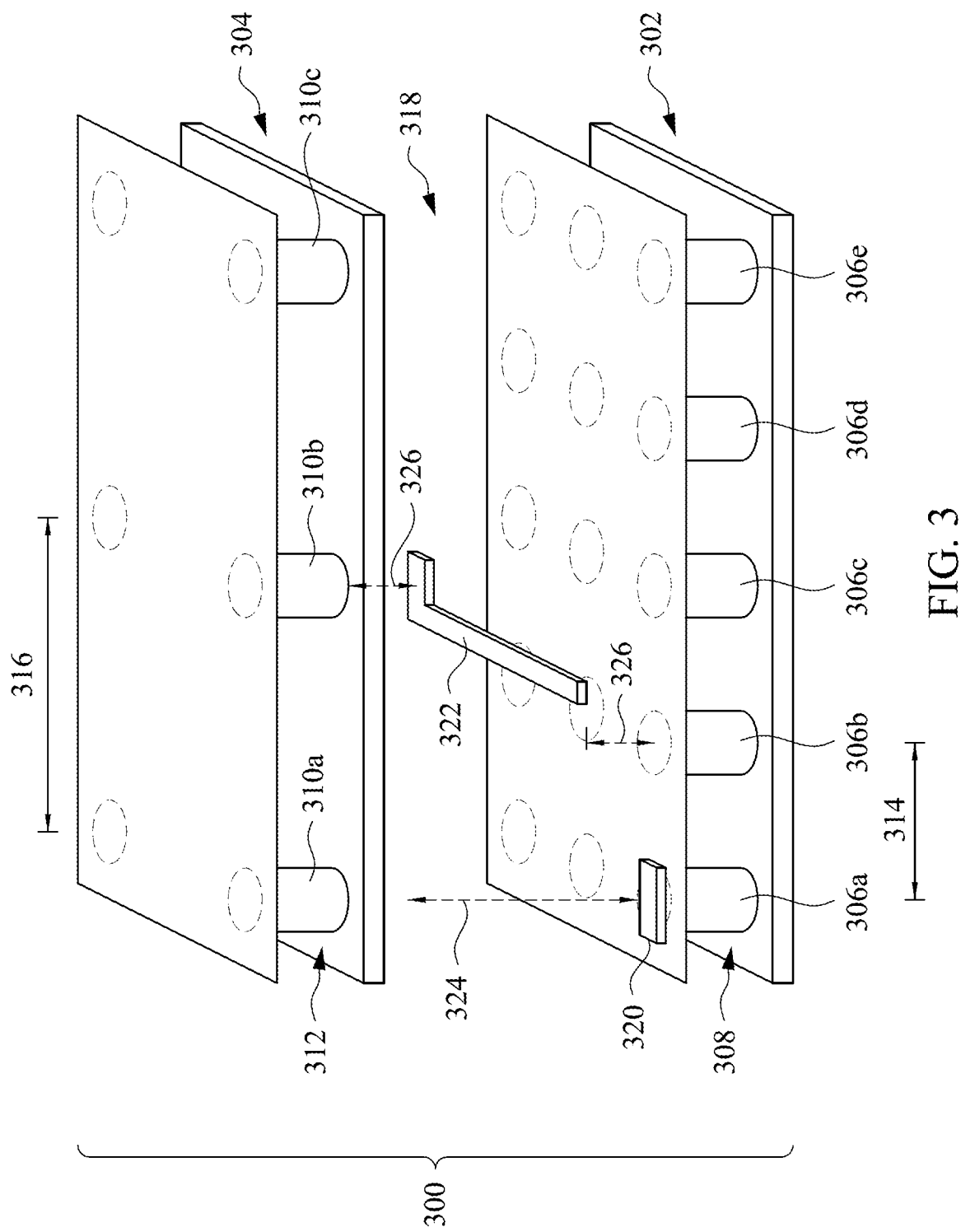
FIG. 3 illustrates connections between vertical interconnect structures on different die layers in the 3D IC in accordance with some embodiments.

FIG. 3 illustrates connections between VISs in different die layers in a 3D IC in accordance with some embodiments. The 3D IC 300 includes a die layer 302 positioned under a die layer 304. The VISs 306a-306e on the die layer 302 are arranged in a first layout 308. The VISs 310a-310c on the die layer 304 are arranged in a second layout 312. As discussed earlier, the first and the second layouts 308, 312 can differ based on improved die area consumption and/or the power requirements of the die layers 302, 304.

For example, the distance 314 between the VISs 306a-306e (the "pitch" of the VISs 306a-306e) is typically the same for the die layer 302, and the pitch 316 for the VISs 310a-310c in the die layer 304. However, the pitch 314 differs from the pitch 316 in the illustrated embodiment. The pitch for the VISs in a particular die layer can be based on several factors. For example, the pitch 314, 316 is defined by one or more design rules for a 3D IC. Additionally, in some embodiments, the minimum distance of the pitch 314, 316 is limited by the fabrication process that is used to manufacture the respective die layer 302, 304. Each die layer in a 3D IC can be fabricated using a particular fabrication process for that die layer. For example, when a processing unit is formed on a die layer, a more expensive fabrication process may be used to manufacture the die layer due to the high-speed requirements for the processing unit. Alternatively, when a die layer includes memory devices, analog devices, and/or a logic devices a less expensive fabrication process can be used to manufacture the die layer due to the slower speed requirements of these types of devices.

Additionally or alternatively, the density of the VISs 306a-306e and the density of the VISs 310a-310c are based on one or more factors. The type of devices on a die layer (e.g., devices 204 on the die layer 200A), the power requirements of the devices on the die layer (e.g., the devices 204 on the die layer 200A), the power requirements of the devices on any die layers positioned over and above of the die layer (e.g., the devices 206 on the die layer 200B), and/or the IR drop experienced by the signals at any die layers positioned over and above the die layer are factors that are considered when determining the density of the VISs in a die layer. Additionally, the density of the VISs can vary across a die layer based on the factors. For example, the density of the VISs in one part of a die layer can differ from the density of the VISs in another part of the die layer based on the type of devices in each section of the die layer, the power requirements of the devices in each section on the die layer, the power requirements of the devices on any die layers positioned over and above of the die layer, and/or the IR drop experienced by the signals at any die layers positioned over and above the die layer.

Positioned between the die layers 302, 304 is an intermediate conductive layer 318 (e.g., a redistribution layer). The electrical connections between the die layers 302, 304 are implemented through the intermediate conductive layer 318. The intermediate conductive layer 318 is patterned to produce one or more contacts (collectively contact 320) and one or more signal lines (collectively signal line 322). The contact 320 is used to electrically connect a VIS in the die layer 302 (e.g., VIS 306a) to a VIS in the die layer 304 (e.g., VIS 310a). The electrical connection between the VIS 306a and the VIS 310a is represented by the dashed line 324.

Since the second layout 312 of the VISs 310a-310c in the die layer 304 differs from the first layout 308 of the VISs 306a-306e in the die layer 302, the signal line 322 is used to route a signal from a VIS in one die layer to a respective VIS in another die layer. For example, as shown in FIG. 3, the signal line 322 electrically connects the VIS 306b on the die layer 302 to the VIS 310b on the die layer 304. The electrical connection between the VIS 306b and the VIS 310b is represented by the dashed lines 326.

Although only one contact 320 and only one signal line 322 are shown in FIG. 3, other embodiments can include any suitable number of contacts and signal lines in the intermediate conductive layer 318. Additionally, although not shown in FIG. 3, an insulating material is disposed around the contact 320 and the signal line 322 to electrically isolate the contact 320 and the signal line 322 from each other and from other contacts and/or signal lines in the intermediate conductive layer 318.

Figure 4:
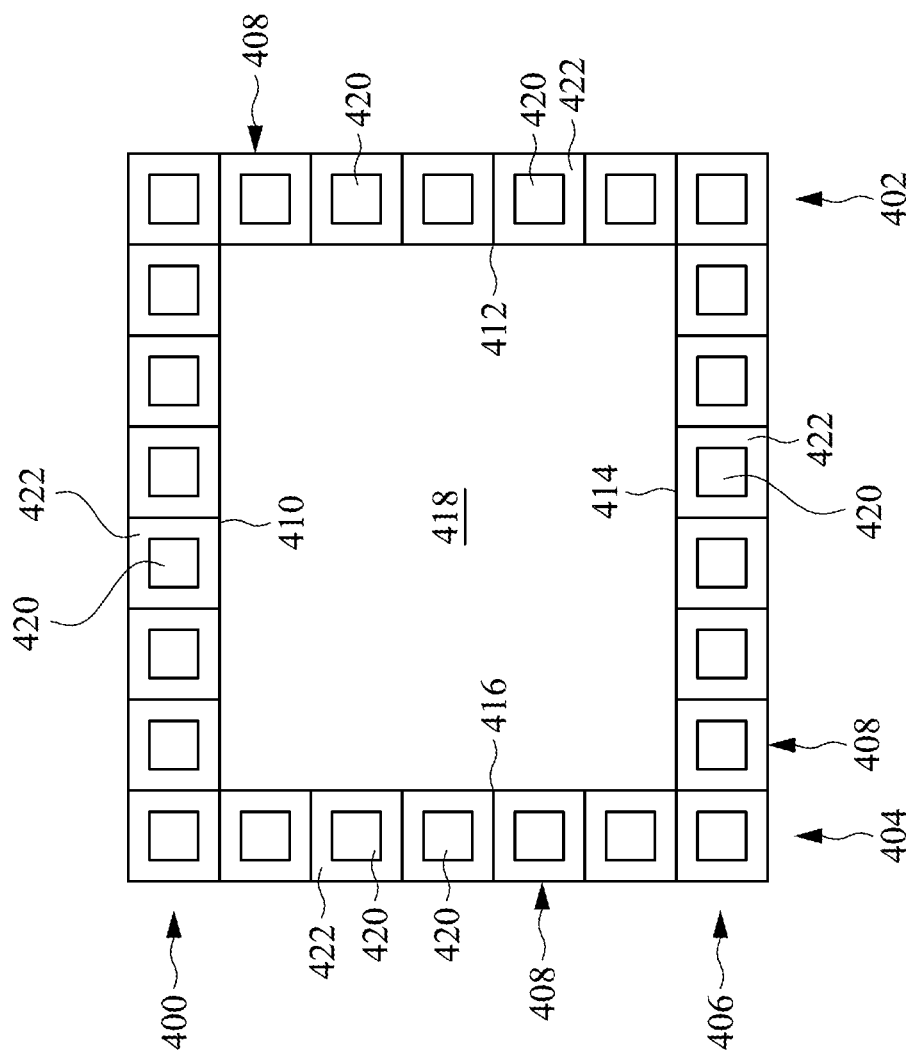
FIG. 4 illustrates a first example of a layout of vertical interconnect structure cells in accordance with some embodiments.

FIG. 4 illustrates a first example of a layout of VIS cells in accordance with some embodiments. Lines 400, 402, 404, 406 of VIS cells 408 are disposed adjacent the edges 410, 412, 416, 414, respectively, of a device 418. A VIS cell 408 includes a VIS 420 and unused die area 422. The size of the unused die area 422 can be based on one or more design rules and/or the requirements of the fabrication process that is used to manufacture the die layer.

The VIS cells 408 form a grid around the device 418. When the device 418 is one of multiple devices on a die layer, the VIS cells 408 that are adjacent another device can be part of the grid of VIS cells around the other device (see e.g., FIGS. 6 and 7). The device 418 can be a device on a bottom die layer (e.g., die layer 200A in FIG. 2), a device on a top die layer (e.g., die layer 200B in FIG. 2), or a device in an intermediate die layer (between a bottom die layer and a top die layer) in a 3D IC structure. The VISs 420 are formed in the VIS cells 408. Although the device 418, the VIS cells 408, and the VISs 420 are shown as having a rectangular shape, other embodiments are not limited to this implementation.

In the illustrated embodiment, the VIS cells 408 surround the device 418 to form a grid and the lines 400, 402, 404, 406 abut the edges 410, 412, 416, 414 of the device 418. As described earlier, the pitch of the VISs 420 is typically the same for the VISs in a respective die layer due to one or more design rules and/or requirements of a fabrication process that is used to manufacture the die layer. In other embodiments, the number of lines 400, 402, 404, 406 of VIS cells 408 can be fewer or greater.

Figure 5:
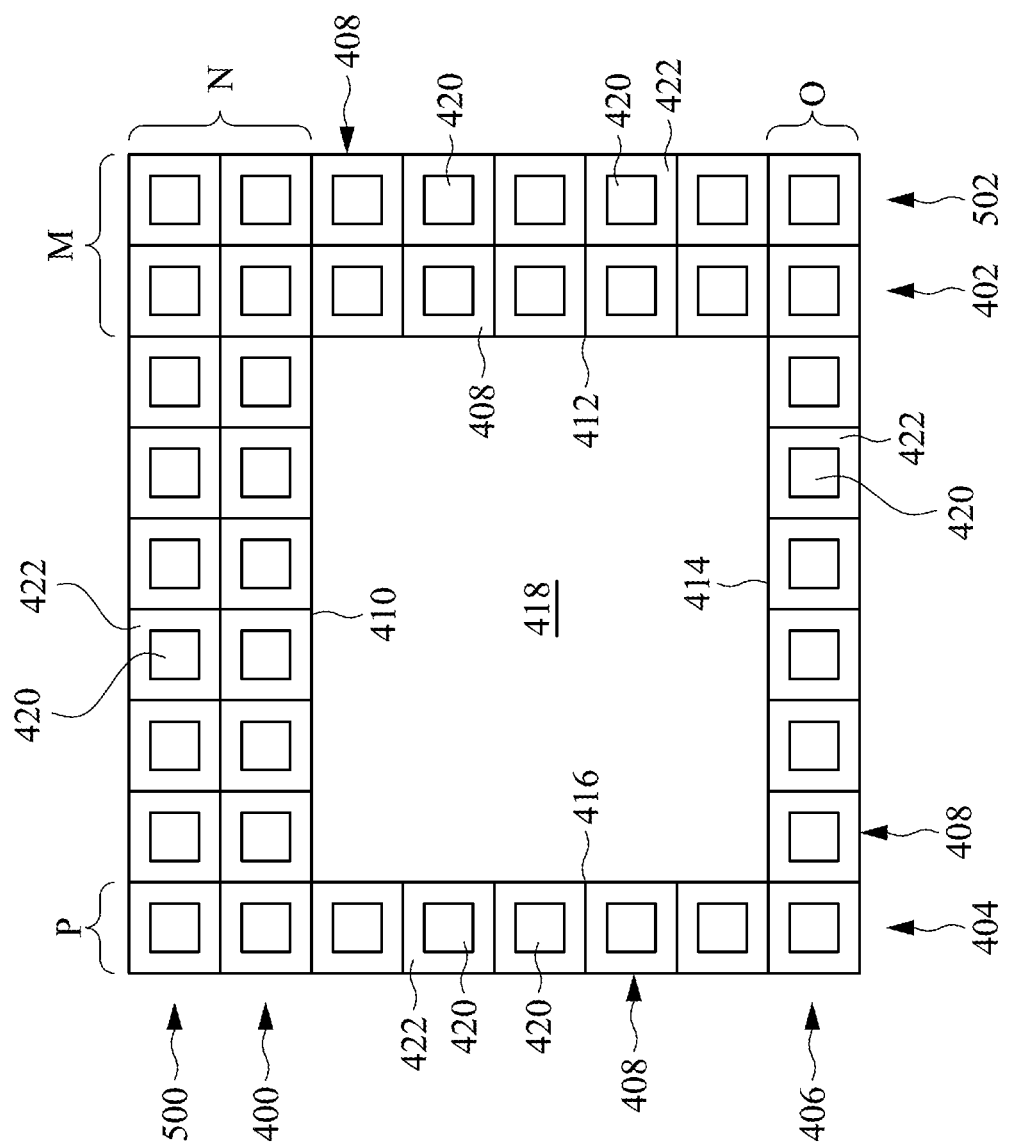
FIG. 5 illustrates a second example of a layout of vertical interconnect structure cells in accordance with some embodiments.

FIG. 5 depicts a second example of a layout of VIS cells in accordance with some embodiments. Like FIG. 4, lines 400, 402, 404, 406 of VIS cells 408 are disposed adjacent each edge 410, 412, 416, 414, respectively, of a device 418. The VIS cells 408 in the lines 400, 402, 404, 406 form a grid around the device 418.

A second line 500 of VIS cells 408 is adjacent and abuts the line 400, and a second line 502 of VIS cells 408 is adjacent and abuts the line 402. The number of VIS cells 408 in each line 400, 402, 404, 406, 500, 502 can be the same number or the number of VIS cells 408 in one line may differ from the number of VIS cells 408 in another line. As noted earlier, the pitch of the VISs 420 is the same for the VISs 420 on the die layer.

In embodiments, the number of lines 400, 402, 404, 406, 500, 502 that are adjacent to the device 418 can be fewer or greater. As shown in FIG. 5, the number of lines 400, 500 adjacent the edge 410 is N, where N=2. The number of lines 402, 502 adjacent the edge 412 is M, where M=2. The number of lines 404, 406 adjacent the respective edges 416, 414 is P and O, where O=P=1. In other embodiments, M, N, O, and P can each be any suitable number. For example, M, N, O, and P can each equal one (1), as shown in FIG. 4. Alternatively, M can equal one (1), N may equal one (1), O can equal one (1), and P may equal three (3).

The number of lines 400, 402, 404, 406, 500, 502 of VIS cells 408 is based on the density of the VISs 420 on a die layer. As described earlier, the density of the VISs 420 is based on one or more factors. The type of devices on a die layer, the power requirements of the devices on the die layer, the power requirements of the devices on any die layers positioned over and above of the die layer, and/or the IR drop experienced by the signals at any die layers positioned over and above the die layer are factors that are considered when determining the density of the VISs 420 in a die layer. Additionally, the density of the VISs 420 can vary across a die layer based on one or more factors. For example, the density of the VISs 420 in one part of a die layer can differ from the density of the VISs 420 in another part of the die layer based on the type of devices in each section of the die layer, the power requirements of the devices in each section on the die layer, the power requirements of the devices on any die layers positioned over and above of the die layer, and/or the IR drop experienced by the signals at any die layers positioned over and above the die layer.

Figure 6:
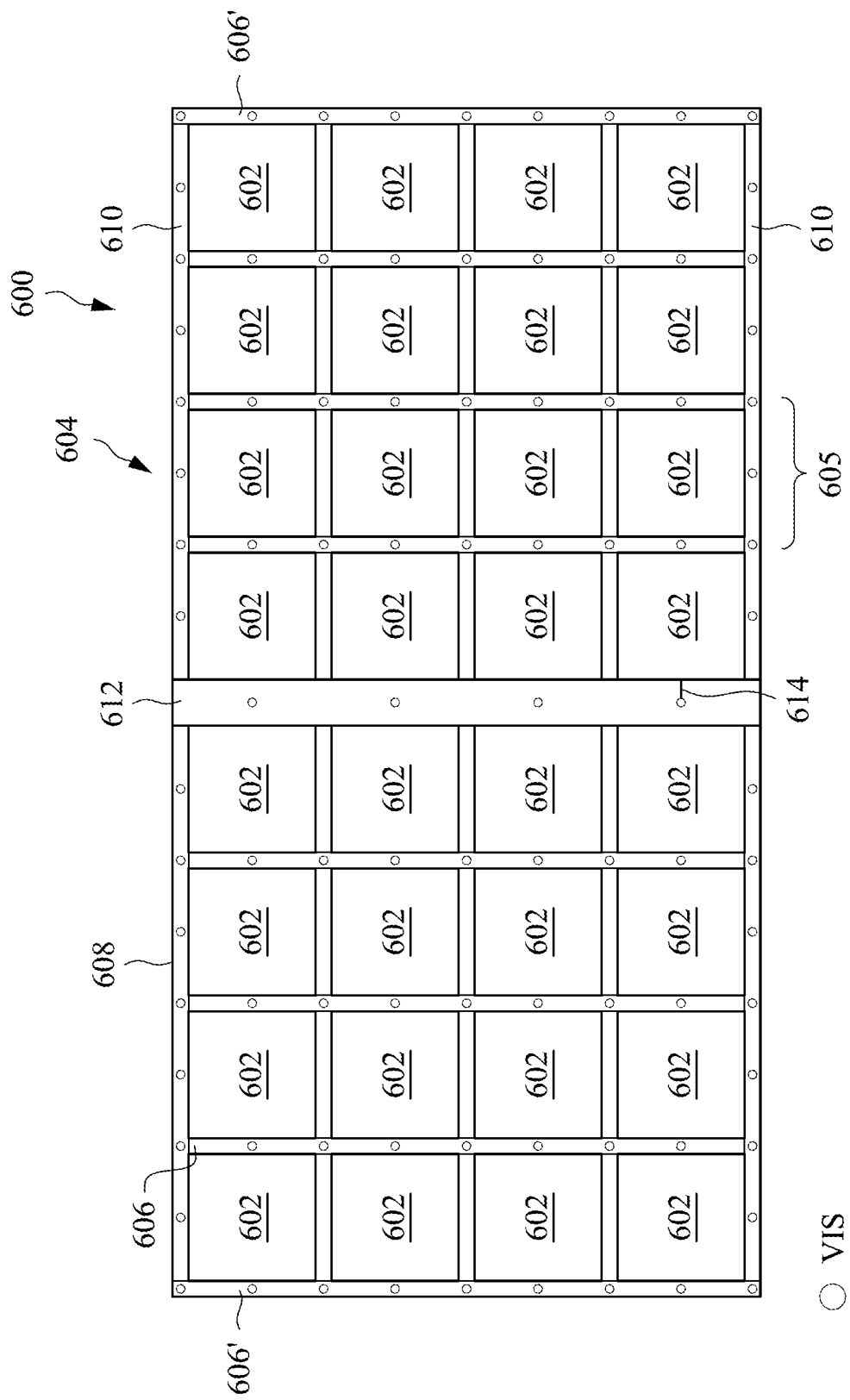
FIG. 6 illustrates a block diagram of a first example of a die layer in accordance with some embodiments.

FIG. 6 depicts a block diagram of a first example of a die layer in accordance with some embodiments. In a non-limiting example, the die layer 600 is the bottom die layer 200A in FIG. 2. Multiple devices 602 are disposed within or on the die layer 600. As discussed earlier, example devices 602 include, but are not limited to, SRAM, RRAM, DRAM, and Flash memory devices, ADCs, I/O devices, and/or computing units.

In FIG. 6, the devices 602 can be the same type of devices (e.g., memory) or at least one type of device 602 (e.g., memory) may differ from another type of device 602 (e.g., logic circuit). In the example embodiment, a first grid 604 of VISs is formed on the die layer 600 such that each device 602 is laterally surrounded by a second grid 605 of VISs. FIG. 6 depicts first lines 606 of VISs (e.g., vertical or perpendicular lines with respect to the edge 608) and second lines 610 of VISs (e.g., horizontal or parallel lines with respect to the edge 608), and a center line 612 of VISs. The number and the arrangement of the VISs are for illustration purposes and other embodiments can have a fewer or a greater number of VISs that are positioned in any given layout.

The VISs can be power VISs that are configured to transmit power signals to the devices 602 and to the devices on one or more additional die layers attached to the die layer 600. In one embodiment, the VISs positioned in the center line 612 of the grid 604 may be data signal VISs that transmit data signals between die layers in the 3D IC structure. Thus, the center line 612 is a signal trunk. In other embodiments, the data signal VISs can be positioned at other locations in a die layer. For example, the data signal VISs can be disposed at one or more of the first lines 606 that are located around the periphery of the die layer 600 (e.g., first lines 606').

In some embodiments, one or more signal lines electrically connects VISs to respective devices. For example, as shown in FIG. 6, the signal line 614 electrically connects the device 602' to a VIS in the center line 612 of VISs. Although only one signal line 614 is depicted in FIG. 6, other embodiments can use any suitable number of signal lines to connect VISs to respective devices.

Figure 7:
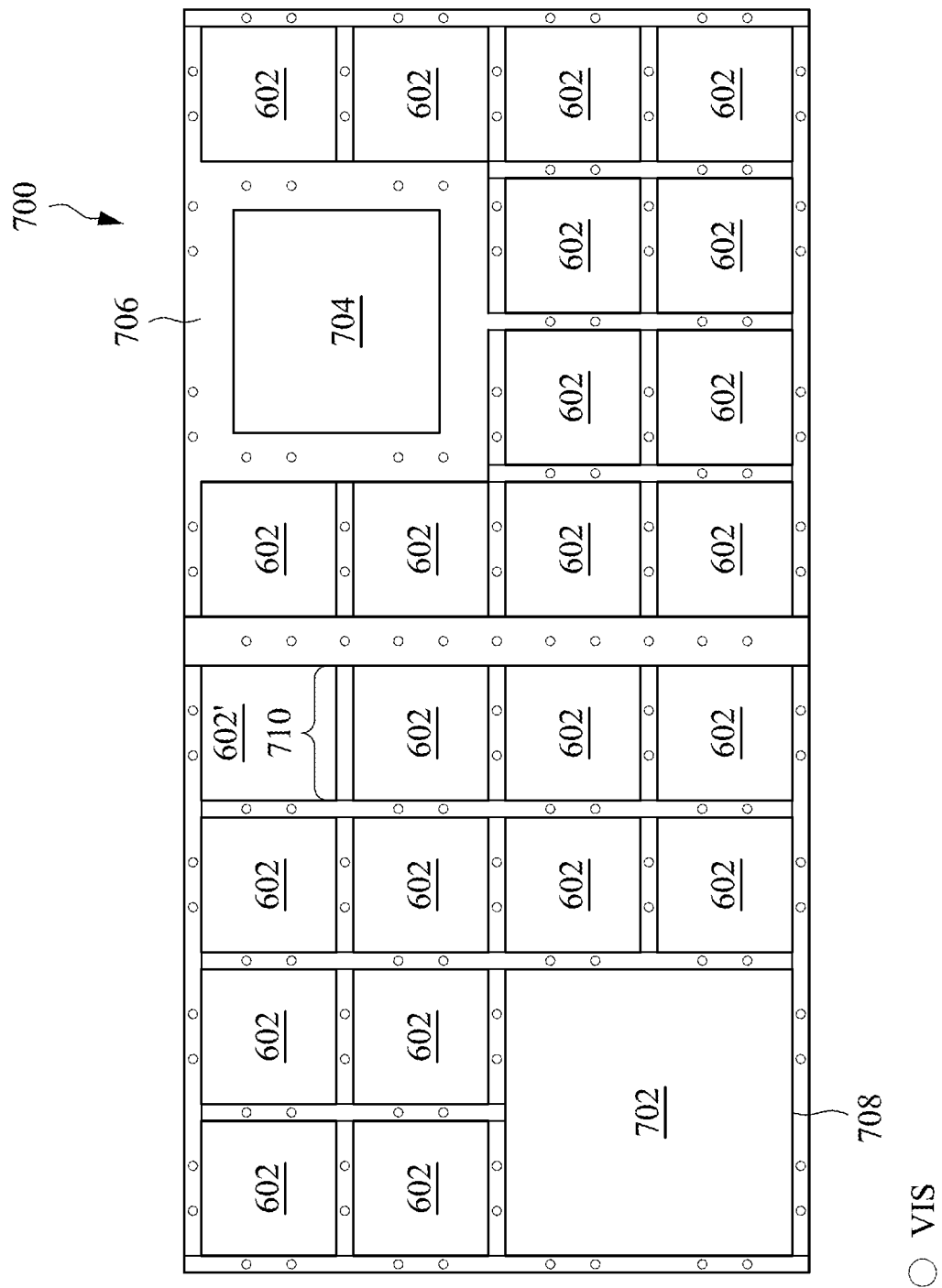
FIG. 7 illustrates a block diagram of a second example of a die layer in accordance with some embodiments.

FIG. 7 illustrates a block diagram of a second example of a die layer in accordance with some embodiments. FIG. 7 shows that at least one device can consume a larger amount of area on a die layer 700 compared to other devices. Additionally, the area of one or more unused die areas can differ from the area of other unused die areas. Thus, the die areas used by the devices and/or the die areas used by the unused die areas can vary in some embodiments.

In a non-limiting example, the die layer 700 is the bottom IC layer 200A in FIG. 2. Multiple devices 602 are disposed within and/or on the die layer 700. As shown in FIG. 7, each of the devices 702, 704 uses a greater amount of area on the die layer 700 compared to the amount of area used by each of the other device 602. Additionally, the amount of area used by the unused die area 706 around a VIS (e.g., unused die area 422 in FIG. 4) that is adjacent the edges of the device 704 is greater than the amounts of area used by the unused die areas 708 around a VIS that is adjacent the device 702. In some embodiments, the size or area of an unused die area is based on the type of device that is adjacent the VIS cells and/or a size of the device 602, 702, 704.

Additionally or alternatively, one or more VISs can be removed (see area 710) to provide additional die area for a larger device 602' and/or to route signal lines. The determination of which VISs to remove is based on the power requirements of the device 602', the power requirements of the devices 602 around the device 602', and/or the power requirements of the devices on any die layers that are positioned over and above the die layer 700.

Figure 8:
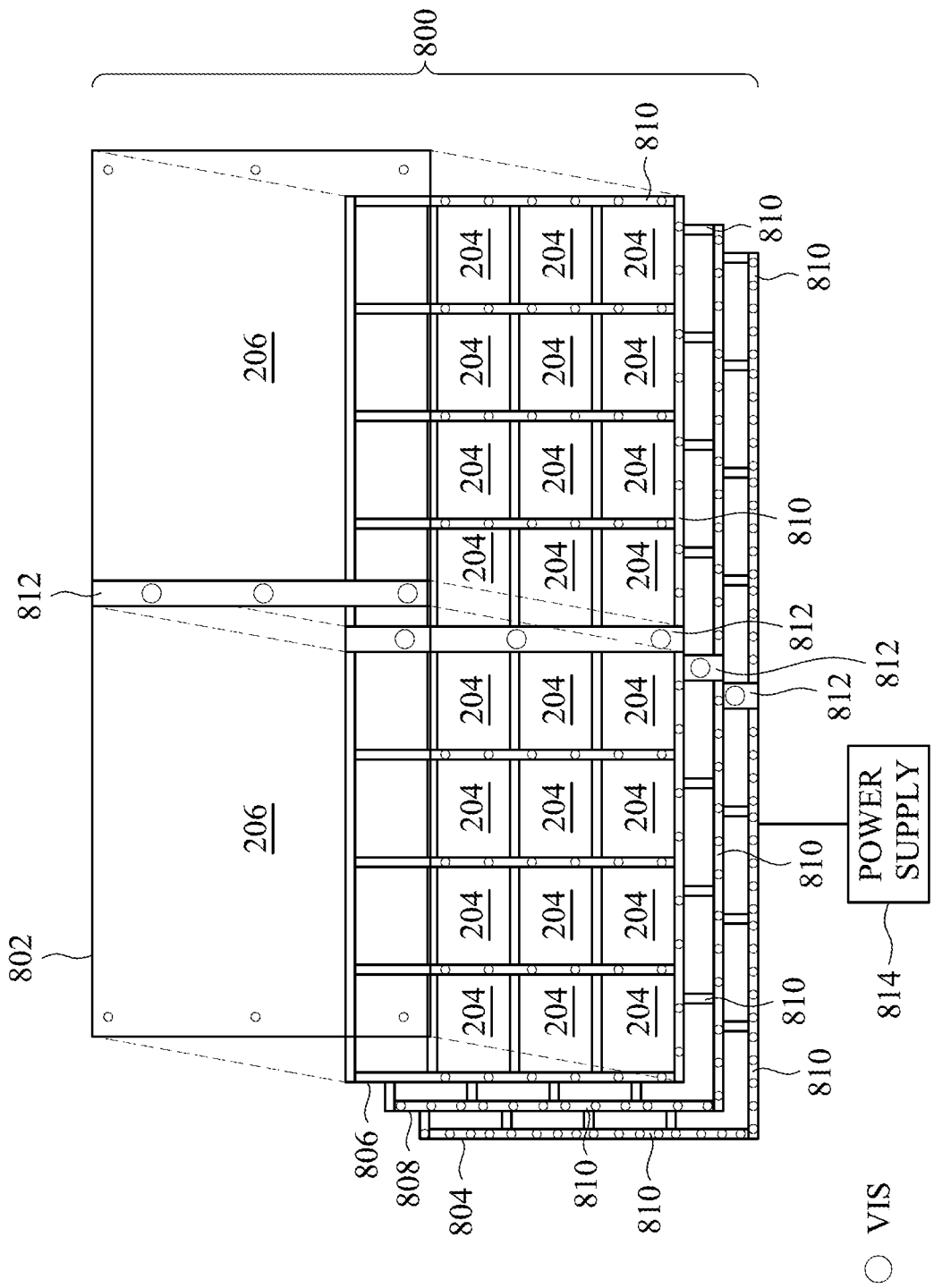
FIG. 8 illustrates a second example of a 3D IC structure in accordance with some embodiments.

FIG. 8 illustrates a second example of a 3D IC structure in accordance with some embodiments. The 3D IC structure 800 includes a top die layer 802, a bottom die layer 804, and intermediate die layers 806, 808. The top die layer 802 includes devices 206 and each of the die layers 804, 806, 808 includes one or more devices 204.

In one embodiment, the lines 810 of VIS cells 408 are disposed in a grid on each die layer 802, 804, 806, 808. The VISs (e.g., VIS 420 in FIG. 4) in the VIS cells 408 are configured to transmit power signals, data signals, and/or analog bias signals between the die layers 802, 804, 806, 808. A center line 812 of VIS cells 408 on the top die layer 802, the bottom die layer 804, and on the intermediate die layers 806, 808 can be configured to transmit data signals between the die layers 802, 804, 806, 808. Other embodiments can transmit data signals, power signals, and/or analog bias signals using any suitable grid layout of VIS cells 408 on each die layer 802, 804, 806, 808.

In one embodiment, a power supply 814 is operably connected to the bottom die layer 804 to provide power signals to the 3D IC 800. In such embodiments, the density of the VISs in the bottom die layer 804 is greater than the density of the VISs in the intermediate die layer 808. The density of the VISs in the intermediate die layer 808 is greater than the density of the VISs in the intermediate die layer 806. The density of the VISs in the intermediate die layer 806 is greater than the density of the VISs in the top die layer 802. The VIS densities on each die layer 802, 804, 806, 808 increase from the top die layer 802 to the bottom die layer 804. The density of the VISs in the bottom die layer 804 is greatest due to the power requirements of the devices 204, 206 on all of the die layers 802, 804, 806, 808. Since the VISs in the bottom die layer 804 supply power signals to all of the die layers 802, 804, 806, 808, the density of the VISs in the bottom die layer 804 is based on the power requirements of the devices 204 on the bottom die layer 804, the power requirements of the devices 204 on the intermediate die layer 808, the power requirements of the devices 204 on the intermediate die layer 806, the power requirements of the devices 206 on the top die layer 802, and/or the IR drops produced as the power signals transmit from the bottom die layer 804 to the intermediate die layer 808, from the intermediate die layer 808 to the intermediate die layer 806, and from the intermediate die layer 806 to the top die layer 802.

The density of the VISs in the intermediate die layer 808 is based on the power requirements of the devices 204 on the intermediate die layer 808, the power requirements of the devices 204 on the intermediate die layer 806, the power requirements of the devices 206 on the top die layer 802, and/or the IR drops produced as the power signals transmit from the intermediate die layer 808 to the intermediate die layer 806, and from the intermediate die layer 806 to the top die layer 802. Similarly, the density of the VISs in the intermediate die layer 806 is based on the power requirements of the devices 204 on the intermediate die layer 806, the power requirements of the devices 206 on the top die layer 802, and/or the IR drops produced as the power signals transmit from the intermediate die layer 806 to the top die layer 802. The density of the VISs in the top die layer 802 is based on the power requirements of the devices 206 on the top die layer 802.

Additionally, as discussed earlier, the pitch and the diameters of the VISs in a respective die layer 802, 804, 806, 808 are the same but the pitch and the diameter of the VISs in one die layer can differ from the pitch and the diameter of the VISs in another die layer. In some embodiments, the density, the pitch, and the diameter of the VISs in each die layer differs from the pitch, the density, and the diameter of the VISs in all of the other die layers.

Figure 9:
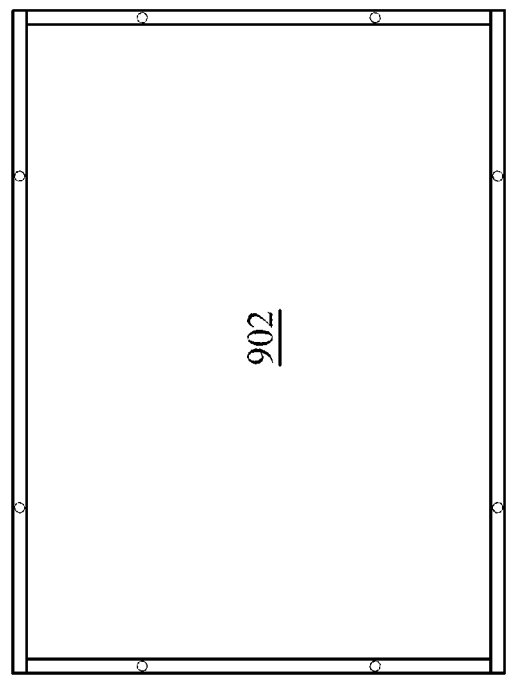
FIG. 9 illustrates a third example of a die layer in accordance with some embodiments.
Figure 10:
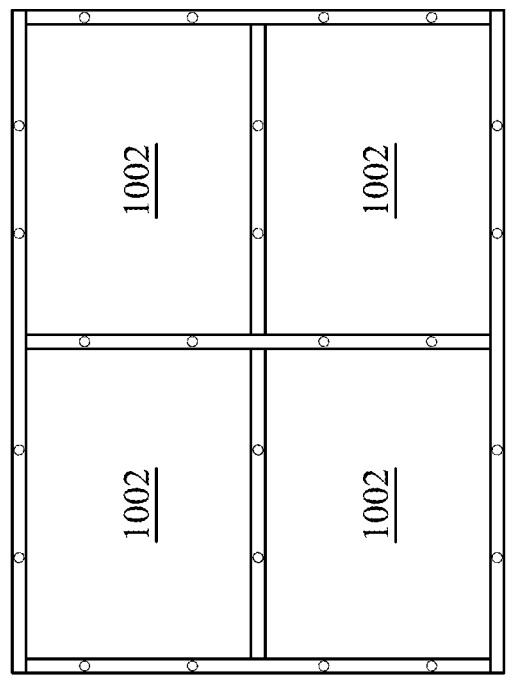
FIG. 10 illustrates a fourth example of a die layer in accordance with some embodiments.
Figure 11:
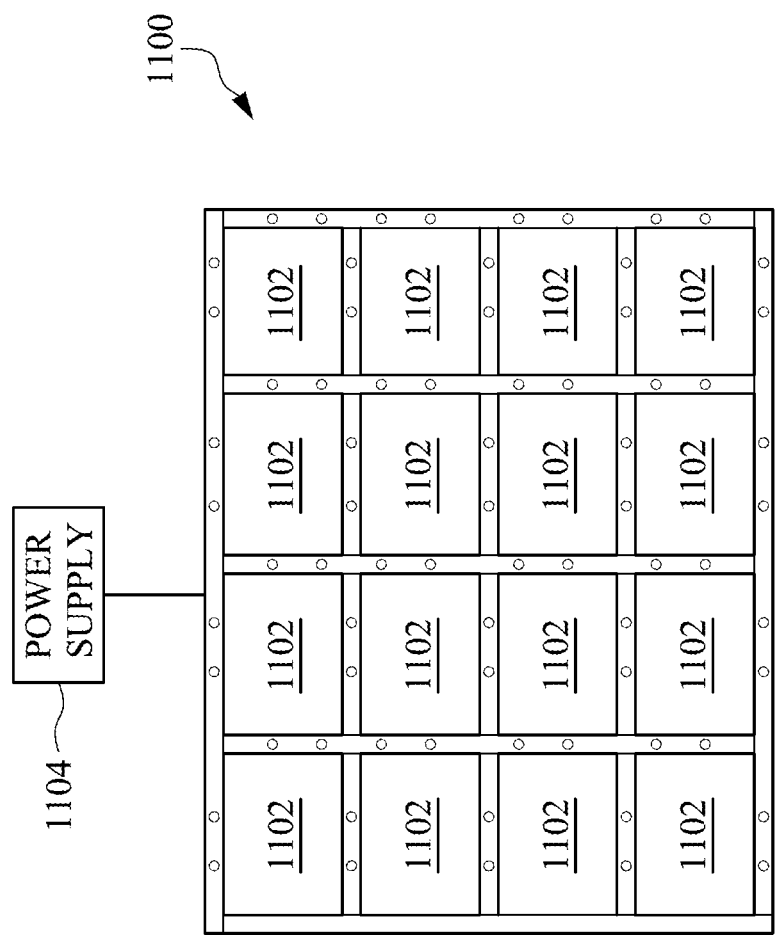
FIG. 11 illustrates a fifth example of a die layer in accordance with some embodiments.

In other embodiments, a power supply is operably connected to a top die layer. In such embodiments, the densities of the VISs is greatest at the top die layer and decreases with each die layer below the top die layer. FIGS. 9-11 illustrate the die layers in a 3D IC where the density of the VISs is greatest at the top die layer and the densities of the VISs decrease with each die layer below the top die layer. FIG. 9 depicts a third example of a die layer in accordance with some embodiments. The die layer 900 is a bottom die layer in the 3D IC structure formed by the die layers 900, 1000, 1100 and includes a device 902. One example of a device 902 is a computing unit. The VISs in the die layer 900 have a first density and are arranged in a grid layout around the device 902.

FIG. 10 illustrates a fourth example of a die layer in accordance with some embodiments. The die layer 1000 is an intermediate die layer in the 3D IC structure formed by the die layers 900, 1000, 1100 and includes an array of four (4) devices 1002. The devices 1002 may be the same type of devices or different types of devices. Example devices 1002 include RF devices, logic devices, analog devices, memory devices, computing units, or combinations thereof. The VISs in the die layer 1000 have a second density, are arranged in a grid layout on the die layer 1000, and are arranged in a grid layout around each device 1002. The second density of the VISs in the die layer 1000 is greater than the first density of the VISs in the die layer 900.

FIG. 11 depicts a fifth example of a die layer in accordance with some embodiments. The die layer 1100 is a top die layer of the 3D IC structure formed by the die layers 900, 1000, and 1100 and includes an array of sixteen (16) devices 1102. As discussed previously, the devices 1102 may be the same type of devices or different types of devices. Example devices 1102 include, but are not limited to, ADCs, analog circuits, RF circuits, logic circuits, I/O device, memory devices, or combinations thereof.

The VISs in the die layer 1100 have a third density, are arranged in a grid layout on the die layer 1100, and are arranged in a grid layout around each device 1102. A power supply 1104 is operably connected to the die layer 1100. Thus, the VISs in the die layer 1100 support the power requirements of all of the devices 902, 1002, and 1102 in the 3D IC structure. Accordingly, the density of the VISs in the die layer 1100 is greater than the densities of the VISs in the die layers 900, 1000.

Figure 12:
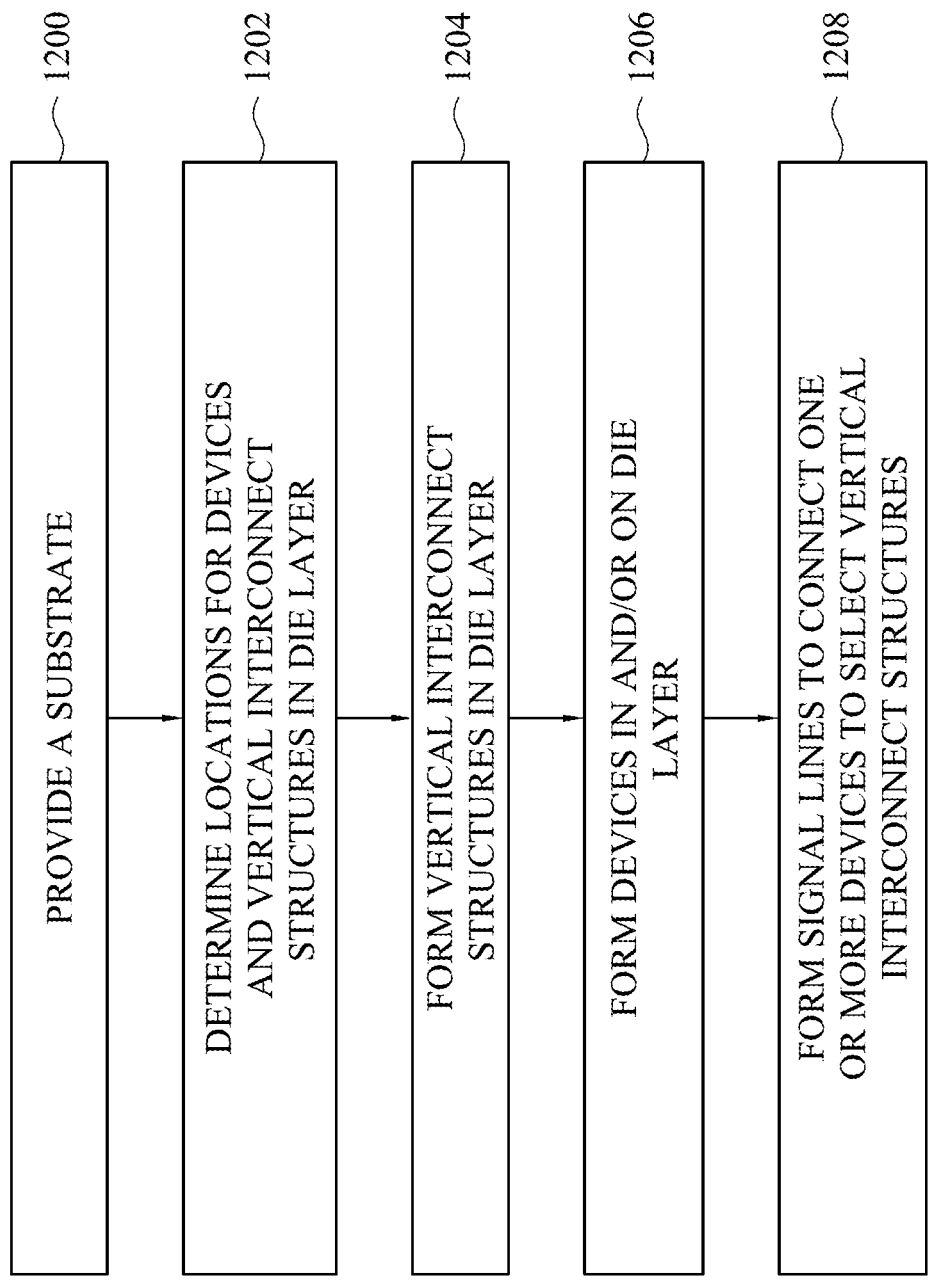
FIG. 12 illustrates a flowchart of an example method of fabricating an IC layer in accordance with some embodiments.

FIG. 12 illustrates a flowchart of an example method of fabricating a die layer in accordance with some embodiments. Initially, as shown in block 1200, a substrate is provided. The substrate can be any suitable type of substrate. Example substrates include, but are not limited to, a silicon substrate, a silicon on insulator (SOI) substrate, a Sapphire substrate, or a compound substrate (e.g., a gallium arsenide substrate, a gallium nitride substrate).

Next, as shown in block 1202, the locations for the devices and the locations for the VISs are determined. In one embodiment, the locations for the devices and the locations for the VISs are determined based on a device specification and a layout diagram. Additionally, the locations can be determined using an EDA. In some embodiments, some or all of the locations are established manually.

The VISs are formed at block 1204. The VISs can be TSVs, TDVs, and other types of vertical interconnect structures. Any suitable process can be used to construct the VISs. For example, one technique for forming TSVs includes forming a first mask layer over the substrate and patterning the first mask layer to include openings where the VISs will be formed.

A conductive material is formed (e.g., deposited) in the openings. In a non-limiting example, the conductive material is deposited using a PVD process or a CVD process. The conductive material can be made of any suitable conductive material, such as copper, cobalt, aluminum, tungsten, doped polysilicon, other suitable conductive material, and/or combinations thereof.

The first mask layer is then removed, and a second mask layer is formed over the substrate. The second mask layer is patterned to include openings where insulating material will be formed around the conductive material. An insulating material is formed in the openings around the conductive material to electrically isolate the TSVs. The second mask layer is then removed.

The devices are formed within and/or on the substrate at block 1206. Any suitable process can be used to construct the devices. One or more signal lines are formed at block 1208 to connect a device or devices to a select VIS in the die layer. The signal line(s) electrically connect a device or devices to a respective VIS.

Figure 13:
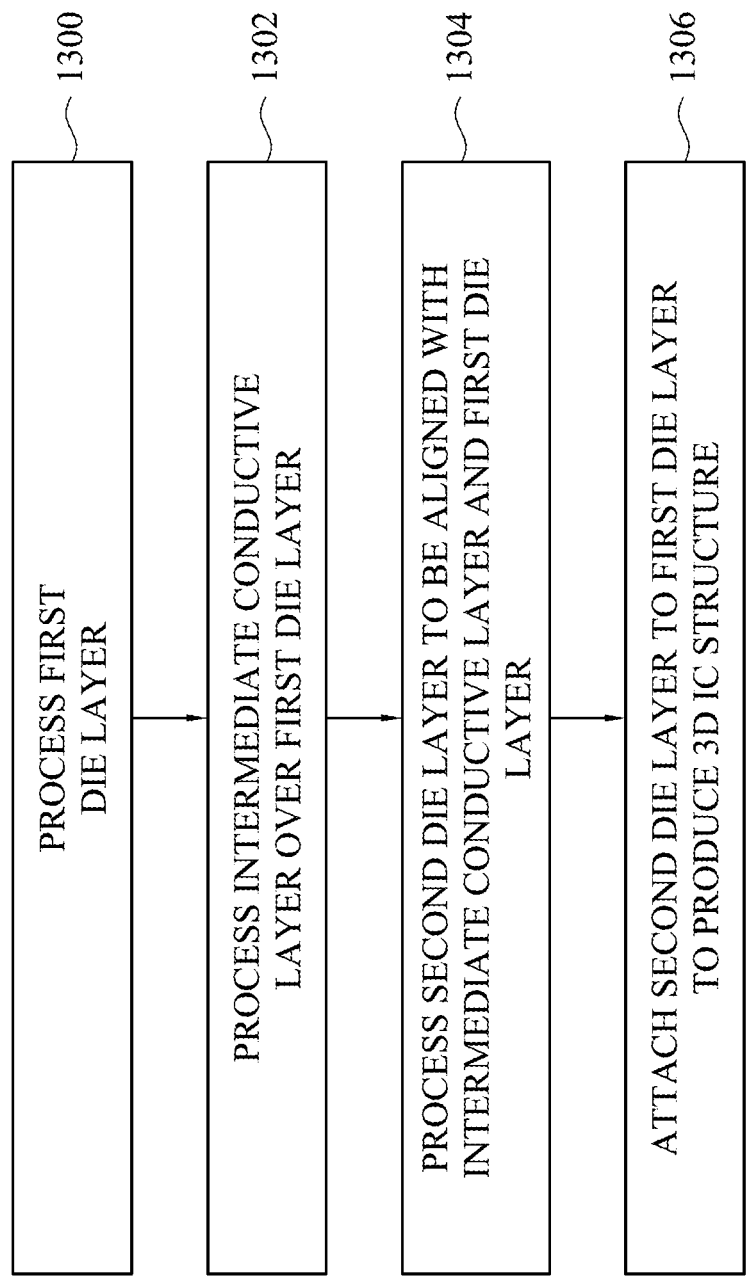
FIG. 13 illustrates a flowchart of an example method of fabricating a 3D IC structure in accordance with some embodiments.

FIG. 13 illustrates a flowchart of an example method of fabricating a 3D IC structure in accordance with some embodiments. Initially, as shown in block 1300, a first die layer is processed. The processing of the first die layer includes forming the devices the VISs, and signal lines within and/or on the first die layer. Any suitable fabrication process can be used to construct the devices, the VISs, and the signal lines.

An intermediate conductive layer is formed on a surface of the first die layer and patterned to produce one or more contacts and/or one or more signal lines (block 1302). In an example process, a conductive material (e.g., copper) is deposited on the surface of the first die layer. A mask layer is formed over the conductive material and patterned to define the locations of the contact(s) and/or signal line(s). The conductive material exposed in the patterned mask layer is removed (etched) to produce the one or more contacts and/or the one or more signal lines. An insulating material is then formed between the contact(s) and/or the signal line(s). As described earlier, the intermediate conductive layer is used to route signals between the first die layer and a second die layer positioned over the first die layer.

A second die layer is processed at block 1304. Similar to the processing of the first die layer, the processing of the second die layer includes forming the devices and the VISs within and/or on the second die layer. The second die layer is processed to align with the first die layer.

Next, as shown in block 1306, the second die layer is attached to the intermediate conductive layer and the first die layer to produce a 3D IC structure. In one embodiment, at least one of the pitch, the density, and or the diameter of the VISs in the first die layer is different from at least one of the pitch, the density, and or the diameter of the VISs in the second die layer. Additionally or alternatively, the VISs in the first die layer are arranged in a first grid layout on the first die and the VISs in the second die layer are arranged in a second grid layout on the second die. The arrangement of the VISs in the first grid layout differs from the arrangement of the VISs in the second grid layout.

In other embodiments, the operations noted in the blocks may occur out of the order as shown in FIGS. 12 and 13. For example, two blocks shown in succession may in fact be executed substantially concurrently. Additionally or alternatively, blocks may be executed in the reverse order, depending upon the functionality/acts involved.

Figure 14:
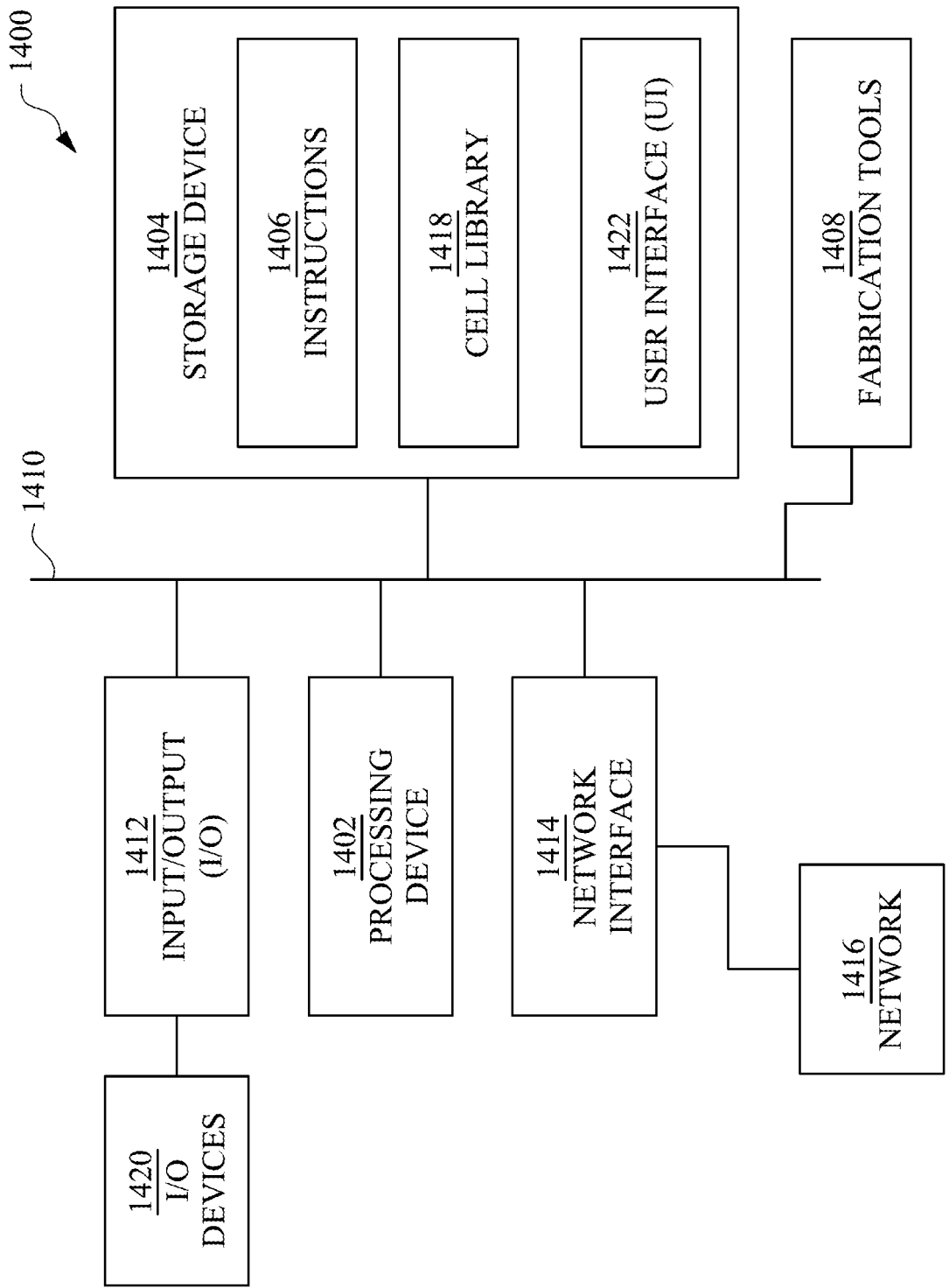
FIG. 14 illustrates an example system that is suitable for designing a 3D IC structure in accordance with some embodiments.

FIG. 14 depicts an example system that is suitable for designing a 3D IC structure in accordance with some embodiments. The design process may be implemented by a computer system, such as an ECAD system. Some or all of the operations for design (e.g., layout) methods disclosed herein are capable of being performed as part of a design procedure performed in a design house, such as the design house 1502 discussed below in conjunction with FIG. 15.

In some embodiments, the system 1400 includes an automated place and route (APR) system. In some embodiments, the system 1400 includes a processing device 1402 and a non-transitory, computer-readable storage medium 1404 ("storage device"). The processing device 1402 is any suitable processing device or processing devices. Example processing devices include, but are not limited to, a central processing unit, a microprocessor, a distributed processing system, an application specific integrated circuit, a graphics processing unit, a field programmable gate array, or combinations thereof.

The storage device 1404 may be encoded with or store, for example, computer program code (e.g., a set of executable instructions 1406). Execution of the executable instructions 1406 by the processing device 1402 represents (at least in part) an ECAD tool that implements a portion or all of, the methods described herein to produce the designs for the structures and the ICs disclosed herein. Further, the fabrication tools 1408 may be included for layout and physical implementation of the ICs. In one or more embodiments, the storage device 1404 is an electronic, magnetic, optical, electromagnetic, infrared, and/or a semiconductor system (or apparatus or device). For example, the storage device 1404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the storage device 1404 includes a compact disk-read only memory (CD-ROM), a compact disk-read/write (CD-R/W), and/or a digital video disc (DVD).

The processing device 1402 is operably connected to the storage device 1404 via a bus 1410. The processing device 1402 is also operably connected to an input/output (I/O) interface 1412 and a network interface 1414 by the bus 1410. The network interface 1414 is operably connected to a network 1416 so that the processing device 1402 and the storage device 1404 are capable of connecting to external elements via the network 1416. In one or more embodiments, the network 1416 is illustrative of any type of wired and/or wireless network, such as an intranet and/or a distributed computing network (e.g., the Internet).

The network interface 1414 allows the system 1400 to communicate with other computing or electronic devices (not shown) via the network 1416. The network interface 1414 includes wireless network interfaces and/or wired network interfaces. Example wireless network interfaces include BLUETOOTH, WIFI, WIMAX, GPRS, or WCDMA. Example wired network interfaces include ETHERNET, USB, or IEEE-1364. In one or more embodiments, some or all of the processes and/or methods disclosed herein are implemented in a distributed system via the network 1416.

The processing device 1402 is configured to execute the executable instructions 1406 encoded in the storage device 1404 to cause the system 1400 to be usable for performing some or all of the processes and/or methods. For example, an electronic design application (e.g., in an ECAD system or as a standalone application) can be configured to perform the methods and techniques shown in FIGS. 1-13.

In one or more embodiments, the storage device 1404 stores the executable instructions 1406 configured to cause the system 1400 to be usable for performing some or all of the processes and/or methods. In one or more embodiments, the storage device 1404 also stores information that facilitates execution of a portion of or all of the processes and/or methods. In one or more embodiments, the storage device 1404 stores a cell library 1418 that includes (at least in part) standard and/or previously designed cells.

The I/O interface 1412 is operably connected to I/O devices 1420. In one or more embodiments, the I/O devices 1420 include one or more of an image capture device, a microphone, a scanner, a keyboard, a keypad, a mouse, a trackpad, a touchscreen, and/or cursor direction keys for communicating information and commands to the processing device 1402. The I/O devices 1420 may also include one or more displays, one or more speakers, a printer, headphones, a haptic or tactile feedback device, and the like.

The system 1400 is configured to receive information through the I/O interface 1412. The information received through the I/O interface 1412 includes one or more of instructions, data, design rules, cell libraries, and/or other parameters for processing by the processing device 1402. The information is transferred to the processing device 1402 via the bus 1410. The system 1400 is configured to receive information related to a user interface (UI) through the I/O interface 1412. The information is stored in the storage device 1404 as a UI 1422 or for presentation in the UI 1422.

In some embodiments, a portion or all of the processes and/or methods is implemented as a standalone software application (e.g., an EDA) for execution by a processing device (e.g., processing device 1402). In some embodiments, a portion or all of the processes and/or methods is implemented as a software application that is a part of an additional software application. In some embodiments, a portion or all of the processes and/or methods is implemented as a plug-in to a software application. In some embodiments, at least one of the processes and/or methods is implemented as a software application that is a portion of an EDA tool. In some embodiments, a portion or all of the processes and/or methods is implemented as a software application that is used by the system 1400. In some embodiments, a layout diagram which includes standard and/or previously designed cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium (e.g., the storage device 1404). Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the system 1400 may include the fabrication tools 1408 for implementing the processes and/or methods stored in the storage device 1404. For instance, a synthesis may be performed on a design in which the behavior and/or functions desired from the design are transformed to a functionally equivalent logic gate-level circuit description by matching the design to cells selected from the cell library 1418. The synthesis results in a functionally equivalent logic gate-level circuit description, such as a gate-level netlist. Based on the gate-level netlist, a photolithographic mask may be generated that is used to fabricate the IC by the fabrication tools 1408. Further aspects of device fabrication are disclosed in conjunction with FIG. 15, which is a block diagram of an integrated circuit manufacturing system, and a manufacturing flow associated therewith, in accordance with some embodiments. In some embodiments, based on a layout diagram, at least one of: (a) one or more semiconductor masks; or (b) at least one component in a layer of a semiconductor IC is fabricated using the manufacturing system 1500.

Figure 15:
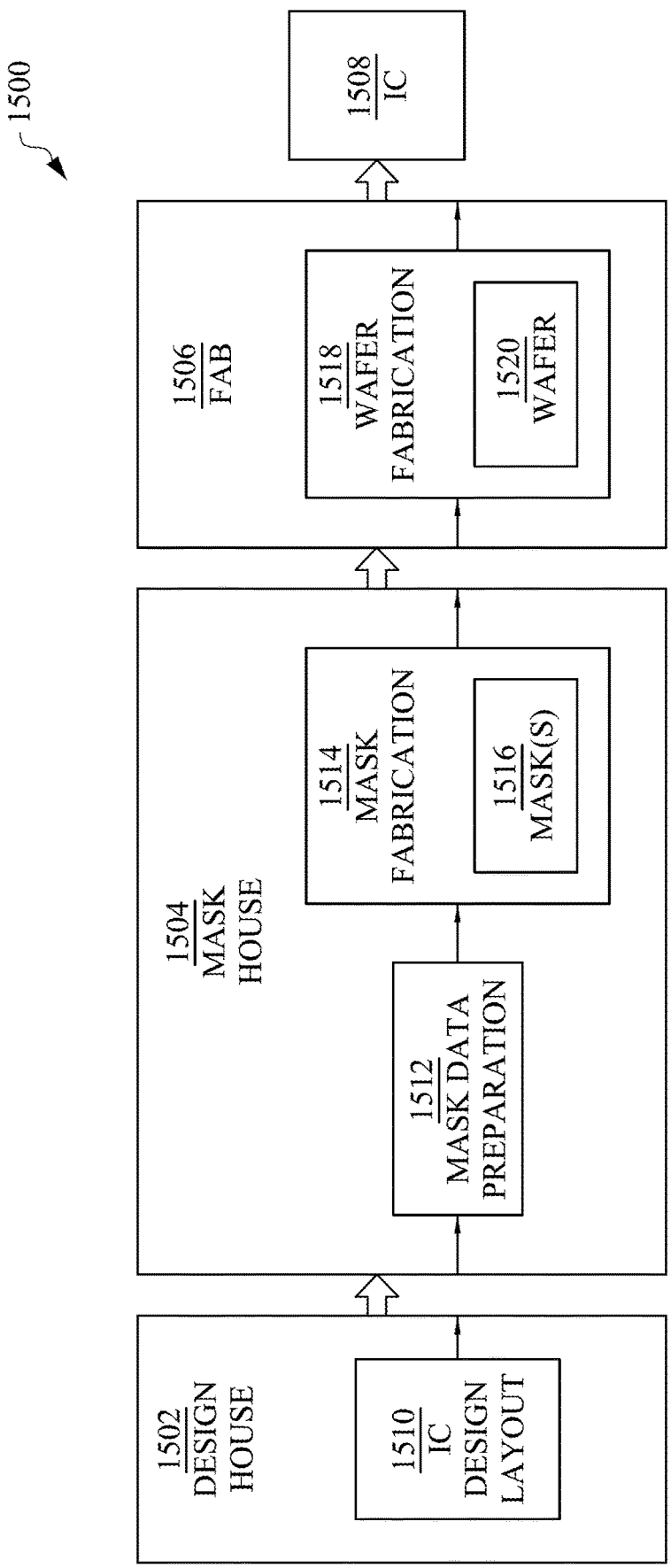
FIG. 15 illustrates a block diagram of an example integrated circuit manufacturing system and manufacturing flow in accordance with some embodiments.

FIG. 15 illustrates a block diagram of an example integrated circuit manufacturing system and manufacturing flow in accordance with some embodiments. In the illustrated embodiment, the IC manufacturing system 1500 includes entities, such as a design house 1502, a mask house 1504, and an IC manufacturer/fabricator ("fab") 1506, that interact with one another in the design, development, and manufacturing cycles and/or services related to manufacturing an IC 1508, such as the ICs disclosed herein. The entities in the system 1500 are operably connected by a communication network (not shown). In some embodiments, the communication network is a single network. In some embodiments, the communication network is a variety of different networks, such as an intranet and the Internet. The communication network includes wired and/or wireless communication channels.

Each entity interacts with one or more of the other entities and provides services to and/or receives services from one or more of the other entities. In some embodiments, two or more of the design house 1502, the mask house 1504, and the IC fab 1506 is owned by a single company. In some embodiments, two or more of the design house 1502, the mask house 1504, and the IC fab 1506 coexist in a common facility and use common resources.

The design house (or design team) 1502 generates an IC design layout diagram 1510. The IC design layout diagram 1510 includes various geometrical patterns, or IC layout diagrams designed for the IC 1508 to be fabricated. The geometrical patterns correspond to patterns of metal, oxide, or semiconductor layers that make up the various components of the IC 1508 to be fabricated. The various layers combine to form various IC features. For example, a portion of the IC design layout diagram 1510 includes various IC features, such as active diffusion regions, gate electrodes, source and drain, metal lines or local vias, and openings for bonding pads, to be formed in a semiconductor substrate (such as a silicon wafer) and various material layers disposed on the semiconductor substrate.

The design house 1502 implements a design procedure to form the IC design layout diagram 1510. The design procedure includes one or more of logic design, physical design or place and route. The IC design layout diagram 1510 is presented in one or more data files having information of the geometrical patterns. For example, the IC design layout diagram 1510 can be expressed in a GDS file format, a GDSII file format, or a DFII file format.

The mask house 1504 includes mask data preparation 1512 and mask fabrication 1514. The mask house 1504 uses the IC design layout diagram 1510 to manufacture one or more masks 1516 to be used for fabricating the various layers of the IC 1508 according to the IC design layout diagram 1510. The mask house 1504 performs mask data preparation 1512, where the IC design layout diagram 1510 is translated into a representative data file ("RDF"). The mask data preparation 1512 provides the RDF to the mask fabrication 1514. The mask fabrication 1514 includes a mask writer (not shown) that converts the RDF to an image on a substrate, such as a mask (reticle) 1516 on a semiconductor wafer. The IC design layout diagram 1510 is manipulated by the mask data preparation 1512 to comply with particular characteristics of the mask writer and/or requirements of the IC fab 1506. In FIG. 15, the mask data preparation 1512 and the mask fabrication 1514 are illustrated as separate elements. In some embodiments, the mask data preparation 1512 and the mask fabrication 1514 can be collectively referred to as a mask data preparation.

In some embodiments, the mask data preparation 1512 includes an optical proximity correction (OPC) that uses lithography enhancement techniques to compensate for image errors, such as those that can arise from diffraction, interference, other process effects and the like. The OPC adjusts the IC design layout diagram 1510. In some embodiments, the mask data preparation 1512 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1512 includes a mask rule checker (MRC) (not shown) that checks the IC design layout diagram 1510 that has undergone processes in OPC with a set of mask creation rules that contain certain geometric and/or connectivity restrictions to ensure sufficient margins, to account for variability in semiconductor manufacturing processes, and the like. In some embodiments, the MRC modifies the IC design layout diagram 1510 to compensate for limitations during the mask fabrication, which may undo part of the modifications performed by OPC in order to meet mask creation rules.

In some embodiments, the mask data preparation 1512 includes lithography process checking (LPC) (not shown) that simulates processing that will be implemented by the IC fab 1506 to fabricate the IC 1508. LPC simulates this processing based on the IC design layout diagram 1510 to create a simulated manufactured device, such as the IC 1508. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, and if the simulated device is not sufficiently close in shape to satisfy design rules, OPC and/or MRC are be repeated to further refine the IC design layout diagram 1510.

It should be understood that the above description of the mask data preparation 1512 has been simplified for the purposes of clarity. In some embodiments, the mask data preparation 1512 includes additional features such as a logic operation (LOP) to modify the IC design layout diagram 1510 according to manufacturing rules. Additionally, the processes applied to the IC design layout diagram 1510 during the mask data preparation 1512 may be executed in a variety of different orders.

After the mask data preparation 1512 and during the mask fabrication 1514, a mask 1516 or a group of masks 1516 are fabricated based on the IC design layout diagram 1510. In some embodiments, the mask fabrication 1514 includes performing one or more lithographic exposures based on the IC design layout diagram 1510. In some embodiments, an electron-beam (e-beam) or a mechanism of multiple e-beams is used to form a pattern on a mask(s) 1516 (photomask or reticle) based on the IC design layout diagram 1510. The mask(s) 1516 can be formed in various technologies. For example, in some embodiments, the mask(s) 1516 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask(s) 1516 includes a transparent substrate (e.g., fused quartz) and an opaque material (e.g., chromium) coated in the opaque regions of the binary mask.

In another example, the mask(s) 1516 is formed using a phase shift technology. In a phase shift mask (PSM) version of the mask(s) 1516, various features in the pattern formed on the phase shift mask are configured to have a proper phase difference to enhance the resolution and imaging quality. In various examples, the phase shift mask can be attenuated PSM or alternating PSM. The mask(s) 1516 generated by the mask fabrication 1514 is used in a variety of processes. For example, a mask(s) 1516 is used in an ion implantation process to form various doped regions in the semiconductor wafer, in an etching process to form various etching regions in the semiconductor wafer, and/or in other suitable processes.

The IC fab 1506 includes wafer fabrication 1518. The IC fab 1506 is an IC fabrication business that includes one or more manufacturing facilities for the fabrication of a variety of different IC products. In some embodiments, the IC fab 1506 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 1506 uses the mask(s) 1516 fabricated by the mask house 1504 to fabricate the IC 1508. Thus, the IC fab 1506 at least indirectly uses the IC design layout diagram 1510 to fabricate the IC 1508. In some embodiments, a semiconductor wafer 1520 is fabricated by the IC fab 1506 using the mask(s) 1516 to form the IC 1508. In some embodiments, the IC fab 1506 includes performing one or more lithographic exposures based at least indirectly on the IC design layout diagram 1510. The semiconductor wafer 1520 includes a silicon substrate or other proper substrate having material layers formed thereon. The semiconductor wafer 1520 further includes one or more of various doped regions, dielectric features, multilevel interconnects, and the like (formed at subsequent manufacturing steps).

In one aspect, a 3D integrated circuit structure includes a first die layer and a second die layer disposed vertically above the first die layer. The first die layer includes one or more first devices and VISs formed in the first die layer and arranged around the one or more first devices in a first grid layout. The second die layer includes multiple second devices and multiple VISs formed in the second die layer and arranged around the second devices in a second grid layout. The first grid layout is different from the second grid layout. A density of the VISs in the second die layer is greater than a density of the VISs in the first die layer.

In another aspect, a system includes a 3D integrated circuit structure and a power supply operably connected to the 3D integrated circuit structure. The 3D integrated circuit structure includes a first die layer and a second die layer. The first die layer includes devices and vertical interconnect structures (VIS) formed in the first die layer and arranged in a first grid layout. The second die layer is attached vertically to the first die layer and includes devices and VISs formed in the second die layer and arranged in a second grid layout. The arrangement of the VISs in the first grid layout is different from the arrangement of the VISs in the second grid layout. A first density of the VISs in the first die layer is different from a second density of the VISs in the second die layer.

In yet another aspect, a method for fabricating a 3D integrated circuit structure includes processing a first die layer to produce a device and a first plurality of vertical interconnect structures (VISs) arranged in a first grid layout on the first die layer. An intermediate conductive layer is processed on the first die layer. A second die layer is processed to produce a plurality of devices and a second plurality of VISs arranged in a second grid layout on the second die layer. The signal line in the intermediate conductive layer electrically connects a respective VIS in the first plurality of VISs to a respective VIS in the second plurality of VISs. The first grid layout on the first die layer is different from the second grid layout on the second die layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a 3D integrated circuit structure, the method comprising:
processing a first die layer to produce a device and a first plurality of vertical interconnect structures (VISs) arranged in a first grid layout on the first die layer;
processing an intermediate conductive layer over the first die layer to produce a signal line;
processing a second die layer to produce a plurality of devices and a second plurality of VISs arranged in a second grid layout on the second die layer; and
attaching the second die layer to the first die layer, wherein:
the arrangement of the first plurality of VISs in the first grid layout is different from the arrangement of the second plurality of VISs in the second grid layout, and
the signal line electrically connects a respective VIS in the first plurality of VISs to a respective VIS in the second plurality of VISs.

2. The method of claim 1, wherein:
the device on the first die layer is a computing unit; and
each device in the plurality of devices comprises one of a memory device, a logic circuit, an input/output device, a sensor, an RF circuit, an analog circuit, or an analog-to-digital converter.

3. The method of claim 1, wherein processing the intermediate conductive layer over the first die layer comprises:
depositing a conductive material on a surface of the first die layer;
forming a mask layer over the conductive material, wherein the mask layer is patterned to define a location of the signal line; and
removing portions of the conductive material exposed in the patterned mask layer to produce the signal line.

4. The method of claim 1, wherein at least one of a pitch, a density, and a diameter of the first plurality of VISs is different from at least one of a pitch, a density, and a diameter of the second plurality of VISs.

5. The method of claim 1, wherein processing the first die layer comprises:
determining locations of the device and the first plurality of VISs;
forming the device and the first plurality of VISs at the locations; and
forming a first die signal line, wherein the first die signal line electrically connects the device to one or more of the VISs of the first plurality of VISs.

6. The method of claim 1, wherein processing the second die layer comprises:
determining locations of the plurality of devices and the second plurality of VISs;
forming the plurality of devices and the second plurality of VISs at the locations; and
forming one or more second die signal lines, wherein the one or more second die signal lines electrically connect a respective device of the plurality of devices to one or more of the VISs of the second plurality of VISs.

7. The method of claim 1, further comprising:
designing the first die layer based on a requirement of the first die layer; and
designing the second die layer based on a requirement of the second die layer.

8. The method of claim 7, wherein:
the requirement of the first die layer comprises one of a type of the device, a speed requirement of the device, or a power requirement of the device; and
the requirement of the second die layer comprises one of types of the plurality of devices, speed requirements of the plurality of devices, or power requirements of the plurality of devices.

9. The method of claim 1, further comprising:
determining a first fabrication process for the first die layer based on a requirement of the first die layer; and
determining a second fabrication process for the second die layer based on a requirement of the second die layer.

10. The method of claim 9, wherein:
the requirement of the first die layer comprises one of a type of the device, a speed requirement of the device, or a power requirement of the device; and
the requirement of the second die layer comprises one of types of the plurality of devices, speed requirements of the plurality of devices, or power requirements of the plurality of devices.

11. A 3D integrated circuit structure, comprising:
a first die layer comprising:
a device, and
a first plurality of vertical interconnect structures (VISs) arranged in a first grid layout on the first die layer;
an intermediate conductive layer comprising any one of (i) a signal line, (ii) a contact, or (iii) a combination of (i) and (ii); and
a second die layer comprising:
a plurality of devices, and
a second plurality of VISs arranged in a second grid layout on the second die layer, wherein:
the arrangement of the first plurality of VISs in the first grid layout is different from the arrangement of the second plurality of VISs in the second grid layout, and
the intermediate conductive layer, via any one of (i) the signal line, (ii) the contact, or (iii) the combination of (i) and (ii), electrically connects a respective VIS in the first plurality of VISs to a respective VIS in the second plurality of VISs.

12. The 3D integrated circuit structure of claim 11, wherein:
the device on the first die layer is a computing unit; and
each device in the plurality of devices comprises one of a memory device, a logic circuit, an input/output device, a sensor, an RF circuit, an analog circuit, or an analog-to-digital converter.

13. The 3D integrated circuit structure of claim 11, wherein at least one of a pitch, a density, and a diameter of the first plurality of VISs is different from at least one of a pitch, a density, and a diameter of the second plurality of VISs.

14. The 3D integrated circuit structure of claim 11, wherein at least one VIS in the first plurality of VISs is configured to transmit a power signal.

15. The 3D integrated circuit of claim 11, wherein at least one VIS in the first plurality of VISs is configured to transmit a data signal.

16. A system, comprising:
a 3D integrated circuit structure; and
a power supply operably connected to the 3D integrated circuit structure, wherein the 3D integrated circuit structure comprises:
  a first die layer comprising:
    a device, and
    a first plurality of vertical interconnect structures (VISs) arranged in a first grid layout on the first die layer;
  an intermediate conductive layer comprising any one of (i) a signal line, (ii) a contact, or (iii) a combination of (i) and (ii); and
  a second die layer comprising:
    a plurality of devices, and
    a second plurality of VISs arranged in a second grid layout on the second die layer, wherein:
      the arrangement of the first plurality of VISs in the first grid layout is different from the arrangement of the second plurality of VISs in the second grid layout, and
      the intermediate conductive layer, via any one of (i) the signal line, (ii) the contact, or (iii) the combination of (i) and (ii), electrically connects a respective VIS in the first plurality of VISs to a respective VIS in the second plurality of VISs.

17. The system of claim 16, wherein:
the device on the first die layer is a computing unit; and
each device in the plurality of devices comprises one of a memory device, a logic circuit, an input/output device, a sensor, an RF circuit, an analog circuit, or an analog-to-digital converter.

18. The system of claim 16, wherein at least one of a pitch, a density, and a diameter of the first plurality of VISs is different from at least one of a pitch, a density, and a diameter of the second plurality of VISs.

19. The system of claim 16, wherein at least one VIS in the first plurality of VISs is configured to transmit a power signal.

20. The system of claim 16, wherein at least one VIS in the first plurality of VISs is configured to transmit a data signal.

* * * * *